(12) United States Patent
Asai et al.

(10) Patent No.: US 10,958,233 B2
(45) Date of Patent: Mar. 23, 2021

(54) COMMON MODE FILTER

(71) Applicant: TDK Corporation, Tokyo (JP)

(72) Inventors: Yugo Asai, Tokyo (JP); Tsutomu Kobayashi, Tokyo (JP); Daisuke Urabe, Tokyo (JP); Hiroshi Suzuki, Tokyo (JP); Emi Ito, Yamagata (JP); Toshio Tomonari, Tokyo (JP)

(73) Assignee: TDK CORPORATION, Tokyo (JP)

( * ) Notice: Subject to any disclaimer, the term of this patent is extended or adjusted under 35 U.S.C. 154(b) by 110 days.

(21) Appl. No.: 16/236,563

(22) Filed: Dec. 30, 2018

(65) Prior Publication Data

US 2019/0229697 A1 Jul. 25, 2019

(30) Foreign Application Priority Data

Jan. 5, 2018 (JP) .............................. JP2018-000752

(51) Int. Cl.
| | |
|---|---|
| *H03H 7/09* | (2006.01) |
| *H01F 27/28* | (2006.01) |
| *H01F 27/24* | (2006.01) |
| *H01F 27/29* | (2006.01) |
| *H01F 17/04* | (2006.01) |
| *H03H 1/00* | (2006.01) |
| *H01F 17/00* | (2006.01) |

(52) U.S. Cl.
CPC .............. *H03H 7/09* (2013.01); *H01F 17/045* (2013.01); *H01F 27/24* (2013.01); *H01F 27/28* (2013.01); *H01F 27/2823* (2013.01); *H01F 27/29* (2013.01); *H01F 2017/0093* (2013.01); *H03H 2001/0035* (2013.01); *H03H 2001/0092* (2013.01)

(58) Field of Classification Search
CPC ................. H01F 27/28; H01F 27/2895; H01F 2017/0093; H01F 27/006; H03H 7/427
USPC .......................................... 333/12, 181, 185
See application file for complete search history.

(56) References Cited

U.S. PATENT DOCUMENTS

| | | | |
|---|---|---|---|
| 2014/0306789 A1* | 10/2014 | Hirai ..................... | H01F 17/045 336/188 |
| 2017/0069418 A1 | 3/2017 | Yamakita | |
| 2017/0294264 A1 | 10/2017 | Hashimoto et al. | |

FOREIGN PATENT DOCUMENTS

| | | |
|---|---|---|
| CN | 103887041 A | 6/2014 |
| JP | 2014-199904 | 10/2014 |

* cited by examiner

*Primary Examiner* — Rakesh B Patel
(74) *Attorney, Agent, or Firm* — Young Law Firm, P.C.

(57) ABSTRACT

Disclosed herein is a common mode filter that includes a winding core part and first and second wires wound in a same direction around the winding core part. A predetermined one turn of the first wire crosses a predetermined one turn of the second wire a plurality of times.

19 Claims, 12 Drawing Sheets

COMMON MODE FILTER

BACKGROUND OF THE INVENTION

Field of the Invention

The present invention relates to a common mode filter and, more particularly, to a common mode filter whose high-frequency characteristics can be finely adjusted.

Description of Related Art

A common mode filter is widely used in many electronic devices, such as mobile electronic devices and on-vehicle LANs, as an element for removing common mode noise superimposed on differential signal lines. In recent years, a common mode filter using a surface-mountable drum core supersedes a common mode filter using a toroidal core (see JP 2014-199904 A).

In the common mode filter described in JP 2014-199904 A, a pair of wires are made to cross each other on the way to thereby enhance symmetry between differential signals in a high-frequency region.

However, when the pair of wires are made to cross each other on the way, the positional relationship between the wires is inverted, so that high-frequency characteristics significantly changes. Thus, with the method of simply crossing the pair of wires once, it is difficult to finely adjust the high-frequency characteristics.

SUMMARY

It is therefore an object of the present invention to provide a common mode filter whose high-frequency characteristics can be finely adjusted.

A common mode filter according to the present invention includes a winding core part and first and second wires wound in the same direction around the winding core part. A predetermined one turn of the first wire crosses a predetermined one turn of the second wire a plurality of times.

According to the present invention, the same turns of the respective first and second wires cross each other a plurality of times, thereby allowing the high-frequency characteristics of the common mode filter to be finely adjusted depending on the number of times of crossing or crossing position.

In the present invention, the predetermined one turn of the first wire and the predetermined one turn of the second wire may cross each other a plurality of times such that one of the first and second wires is positioned on the upper side, and the other one thereof is positioned on the lower side. This allows the same turns of the respective first and second wires to cross each other a plurality of times without twisting them.

In the present invention, the winding core part may include a first winding area positioned on one axial end side thereof, a second winding area positioned on the other axial end side thereof, and a third winding area positioned between the first and second winding areas. The first and second wires may constitute a first winding block wound in the first winding area and a second winding block wound in the second winding area and cross each other in the third winding area. The predetermined one turn of the first wire and the predetermined one turn of the second wire may be included in the first winding block. This enhances symmetry between the first and second winding blocks, making it possible to obtain excellent high-frequency characteristics.

In the present invention, the first and second winding blocks may each include a first winding layer positioned in the lower layer and a second winding layer positioned on the upper layer of the first winding layer. The first winding block may include a first layer part in which one of the first and second wires is positioned in the first winding layer and the other one thereof is positioned in the second winding layer and a non-layer part in which both the first and second wires are positioned in the first winding layer. The predetermined one turn of the first wire and the predetermined one turn of the second wire may be included in the non-layer part. With this configuration, a capacitance component generated between the first and second wires changes. Although its concrete mechanism is not yet revealed, even when there exists a difference in that a pair of wires cross each other in one end portion and they do not cross each other in the other end portion, the change suppresses unbalance caused due to the difference, with the result that reflection characteristics can be improved. In addition, the first and second wires are made to cross each other a plurality of times in the non-layer part, so that noise conversion characteristics (e.g., Ssd21 characteristics) are also enhanced.

In the present invention, the second winding block may include a second layer part in which one of the first and second wires is positioned in the first winding layer and the other one thereof is positioned in the second winding layer. This enhances symmetry between the first and second winding blocks, making it possible to obtain more excellent high-frequency characteristics.

In the present invention, the number of turns in the first layer part and the number of turns in the second layer part may be equal to each other. This makes the first and second layer parts symmetric with respect to a portion where the first and second wires cross each other, making it possible to obtain still more excellent high-frequency characteristics.

In the present invention, the first and second wires may be positioned in the first winding layer and in the second winding layer, respectively, in the first layer part, and the first and second wires may be positioned in the second winding layer and in the first winding layer, respectively, in the second layer part. This can reduce the difference between the lengths of the first and second wires.

The common mode filter according to the present invention may further include a first flange part provided at one axial end of the winding core part, a second flange part positioned at the other axial end of the winding core part, first and second terminal electrodes provided on the first flange part and connected respectively with one ends of the first and second wires, and third and fourth terminal electrodes provided on the second flange part and connected respectively with the other ends of the first and second wires, and the non-layer part may be positioned between the one ends of the first and second wires and the first layer part. This can change a capacitance component generated in the vicinity of the one ends of the first and second wires.

In the present invention, the first and second wires may cross each other even number of times in the first winding block, and the last turns, which are closest to the other ends of the respective first and second wires, of the respective first and second wires may cross each other once in the second winding block. This prevents the positional relationship between the first and second wires before and after the predetermined turns of the first and second wires from changing, allowing high-frequency characteristics to be finely adjusted.

As described above, according to the present invention, it is possible to provide a common mode filter whose high-frequency characteristics can be finely adjusted.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
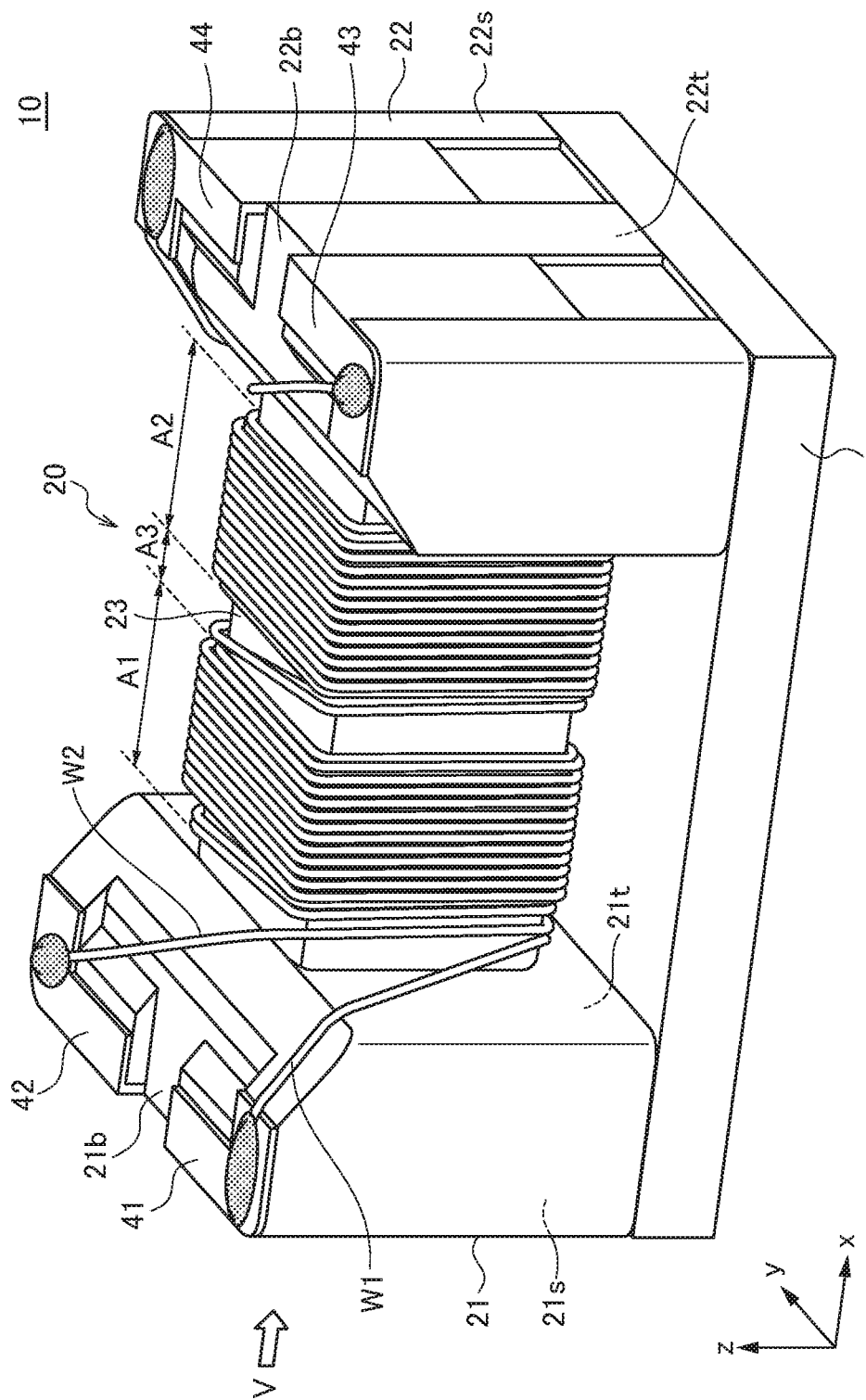
FIG. 1 is a schematic perspective view illustrating the outer appearance of a common mode filter according to a preferred embodiment of the present invention.

FIG. 1 is a schematic perspective view illustrating the outer appearance of a common mode filter 10 according to a preferred embodiment of the present invention.

As illustrated in FIG. 1, the common mode filter 10 according to the present embodiment includes a drum core 20, a plate core 30, first to fourth terminal electrodes 41 to 44, and first and second wires W1 and W2. The drum core 20 and plate core 30 are each made of a magnetic material having comparatively high permeability, such as an Ni—Zn based ferrite. The first to fourth terminal electrodes 41 to 44 are each a metal fitting made of a good conductor material such as copper. The first to fourth terminal electrodes 41 to 44 may be obtained by directly baking silver paste or the like onto the drum core 20.

The drum core 20 has a first flange part 21, a second flange part 22, and a winding core part 23 disposed between the first and second flange parts 21 and 22. The winding core part 23 has its axial direction in the x-direction. The first and second flange parts 21 and 22 are disposed at both ends of the winding core part 23 in the axial direction and integrally formed with the winding core part 23. The plate core 30 is bonded to upper surfaces 21$t$ and 22$t$ of the respective flange parts 21 and 22. The upper surfaces 21$t$ and 22$t$ of the respective flange parts 21 and 22 constitute the xy plane, and their opposite surfaces are used as mounting surfaces 21$b$ and 22$b$. The first and second terminal electrodes 41 and 42 are each provided on the mounting surface 21$b$ and an outer surface 21$s$ of the first flange part 21, and the third and fourth terminal electrodes 43 and 44 are each provided on the mounting surface 22$b$ and an outer surface 22$s$ of the second flange part 22. The outer surfaces 21$s$ and 22$s$ each constitute the yz plane. The first to fourth terminals 41 to 44 are fixed by using an adhesive or the like.

The first and second wires W1 and W2 are wound around the winding core part 23 in the same direction. One and the other ends of the first wire W1 are connected respectively to the first and third terminal electrodes 41 and 43, and one and the other ends of the second wire W2 are connected respectively to the second and fourth terminal electrodes 42 and 44. The numbers of turns of the first and second wires W1 and W2 are the same.

As illustrated in FIG. 1, the winding core part 23 of the drum core 20 includes a first winding area A1 positioned on the first flange part 21 side, a second winding area A2 positioned on the second flange part 22 side, and a third winding area A3 positioned between the first and second winding areas A1 and A2. The first and second wires W1 and W2 are aligned and wound in the first and second winding areas A1 and A2 and cross each other in the third winding area A3. When the first and second wires W1 and W2 cross each other, the positional relationship between the first and second wires W1 and W2 is inverted before and after the crossing point.

Figure 2:
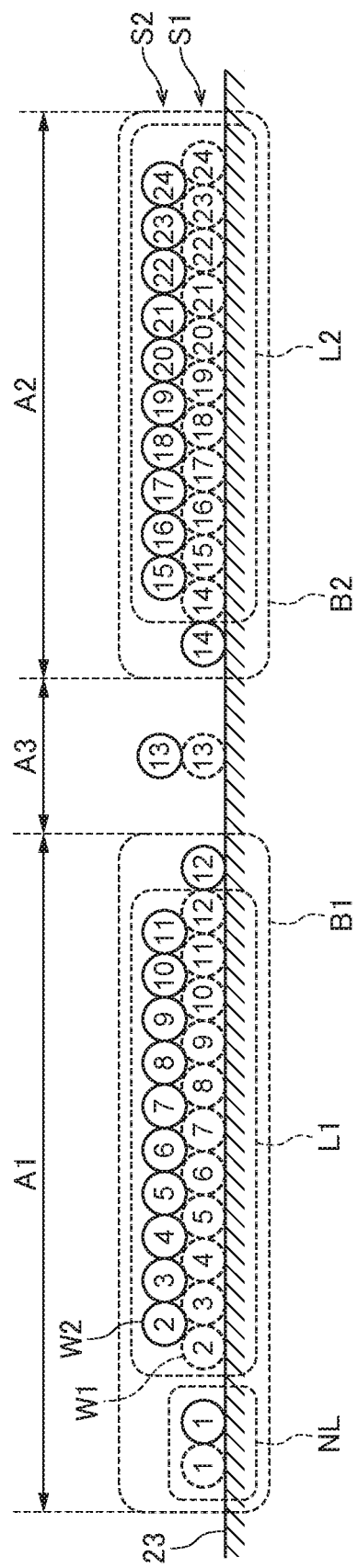
FIG. 2 is a schematic view for more specifically explaining the winding layout of the first and second wires.

FIG. 2 is a schematic view for more specifically explaining the winding layout of the first and second wires W1 and W2.

As illustrated in FIG. 2, the first and second wires W1 and W2 constitute a first winding block B1 wound around the first winding area A1 and a second winding block B2 wound around the second winding area A2 and, as described above, cross each other in the third winding area A3. In the example of FIG. 2, the first and second wires W1 and W2 each have a 24-turn configuration including 1st to 24th turns, but not limited thereto. Further, the first and second winding blocks B1 and B2 each have a double layer structure including a first winding layer S1 positioned in the lower layer and directly wound around the winding core part 23 and a second winding layer S2 positioned on the upper layer of the first winding layer S1 and wound around the winding core part 23 through the first winding layer S1.

The first winding block B1 includes a first layer part L1 in which the first and second wires W1 and W2 are positioned in the first winding layer S1 (lower layer) and in the second winding layer S2 (upper layer), respectively, and a non-layer part NL. In the present embodiment, when the number of turns is counted with the first and second terminal electrodes 41 and 42 as the starting point, the 1st turns of the respective first and second wires W1 and W2 constitute the non-layer part NL, and the 2nd to 12th turns of the first wire W1 and the 2nd to 11th turns of the second wire W2 constitute the first layer part L1. Although the 12th turn of the second wire W2 is positioned in the first winding layer S1, it may be regarded as a part of the first layer part L1. This is because, in order to make the wires constituting the double layer structure stable, it is necessary to wound the upper layer wire along the valley line of the adjacent wires positioned in the lower layer, so that the number of turns of the wire positioned in the upper layer is smaller by one than the number of turns of the wire positioned in the lower layer, and the 12th turn of the second wire W2 corresponds to this.

Figure 3:
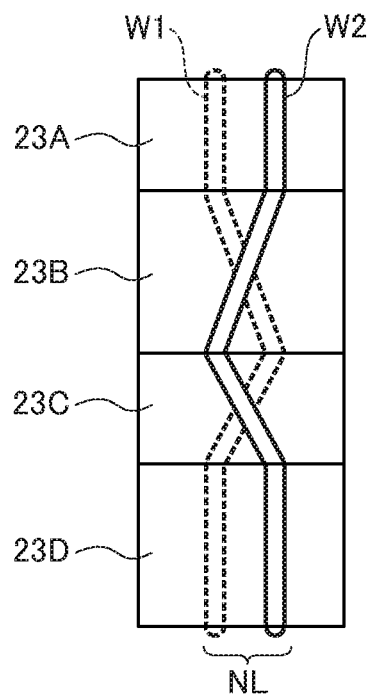
FIG. 3 is a developed view of the winding core part, which illustrates a portion where the non-layer part is wound.

FIG. 3 is a developed view of the winding core part 23, which illustrates a portion where the non-layer part NL is wound.

In the example of FIG. 3, the first and second wires W1 and W2 cross each other twice in the non-layer part NL. In FIG. 3, side surfaces 23A and 23C of the winding core part 23 are each the xz surface, and upper and lower surfaces 23B and 23D are each the xy surface. The upper surface 23B faces in the same direction as upper surfaces 21t and 22t of the respective first and second flange parts 21 and 22, and the lower surface 23D faces in the same direction as mounting surfaces 21b and 22b of the respective first and second flange parts 21 and 22. Further, in the example of FIG. 3, the first and second wires W1 and W2 cross each other on the upper surface 23b and side surface 23C. As described above, in the non-layer part NL, the first and second wires W1 and W2 cross each other twice. In this case, although the upper wire is locally separated from the first winding layer S1 (lower layer) at the crossing portion, both the first and second wires W1 and W2 are basically positioned in the first winding layer S1 (lower layer) in the non-layer part NL. Particularly, at the edges of the winding core part 23 extending in the x-direction, the first and second wires W1 and W2 constituting the non-layer part NL constitute the first winding layer S1 while contacting the winding core part 23.

In the non-layer part NL, the first and second wires W1 and W2 cross each other twice, so that the positional relationship between the first and second wires W1 and W2 is restored to its original state although it is locally inverted. In the example of FIG. 3, the first wire W1 and the second wire W2 are positioned on the lower side and on the upper side, respectively, at both the two crossing positions; however, the vertical positional relationship between them may be inverted. At any rate, when the first and second wires W1 and W2 are made to cross each other twice such that one of the first and second wires W1 and W2 is positioned on the upper side, and the other one thereof is positioned on the lower side, it is possible to wind the first and second wires W1 and W2 without twisting each other. Further, the edge of the winding core part 23 extending in the x-direction exists at the boundary between the upper surface 23B and the side surface 23C on both of which the wires cross each other, and the first and second wires W1 and W2 are fixed at this edge, so that the first and second wires W1 and W2 are by no means uncrossed even when they are not twisted each other.

Figure 4:
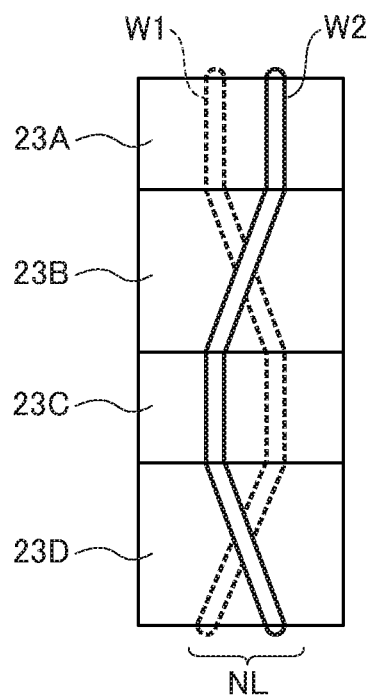
FIG. 4 is a developed view of the non-layer part according to a modification.

The crossing position between the first and second wires W1 and W2 in the non-layer part NL is not limited to the position illustrated in FIG. 3. For example, the first and second wires W1 and W2 may be made to cross each other on the upper surface 23B and lower surface 23D as illustrated in FIG. 4. That is, the surfaces on which the first and second wires W1 and W2 cross each other may be arbitrarily determined. The first and second wires W1 and W2 may be made to cross each other twice on one surface; in this case, however, it is necessary to position the first and second wires W1 and W2 using, e.g., projections or the like provided on the winding core part 23 or to twist the first and second wires W1 and W2 so as not to allow the first and second wires W1 and W2 to be uncrossed.

Figure 5:
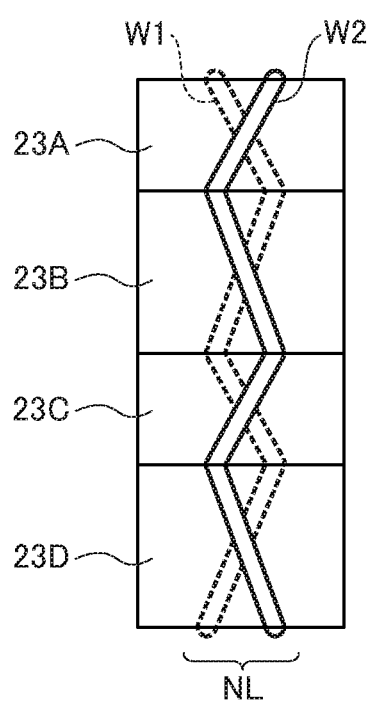
FIG. 5 is a developed view of the non-layer part according to another modification.

The number of times of crossing between the first and second wires W1 and W2 in the non-layer part NL is not limited to two, and may be four as illustrated in FIG. 5. In the example of FIG. 5, the first and second wires W1 and W2 cross each other on all the surfaces (side surfaces 23A and 23C, upper surface 23B, lower surface 23D) of the winding core part 23. In this case as well, the number of times of crossing is even, so that the positional relationship between the first and second wires W1 and W2 is restored to its original state. Further, although not illustrated, the winding core part 23 may have a hexagonal cross-sectional shape, and the first and second wires W1 and W2 may be made to cross each other six times in the non-layer part NL.

As described above, the crossing position in the non-layer part NL between the first and second wires W1 and W2 and the number of times of crossing are not limited, and high-frequency characteristics change subtly. Thus, the crossing position and the number of times of crossing may be selected according to target high-frequency characteristics.

On the other hand, the second winding block B2 has a second layer part L2 in which the first and second wires W1 and W2 are positioned in the first winding layer S1 (lower layer) and in the second winding layer S2 (upper layer), respectively, but does not have the non-layer part. The second layer part L2 includes the 14th to 24th turns of the first wire W1 and the 15th to 24th turns of the second wire W2. Although the 14th turn of the second wire W2 is positioned in the first winding layer S1, it may be regarded as a part of the second layer part L2 for the reason described above.

With the above configuration, in the first winding block B1, the number of turns in the first winding layer S1 (lower layer) is 14, and the number of turns in the second winding layer S2 (upper layer) is 10, so the difference therebetween is 4. On the other hand, in the second winding block B2, the number of turns in the first winding layer S1 (lower layer) is 12, and the number of turns in the second winding layer S2 (upper layer) is 10, so the difference therebetween is 2. As described above, in the present embodiment, the difference in the number of turns between the first winding layer S1 and the second winding layer S2 is larger by two in the first winding block B1 than in the second winding block B2. The difference of two turns is due to the existence of the non-layer part NL. In the non-layer part NL, a capacitance component generated between the first and second wires W1 and W2 is different from that generated therebetween in the first layer part L1 and that generated therebetween in the second layer part L2.

The 13th turns of the respective first and second wires W1 and W2 cross each other in the third winding area A3. When the first and second wires W1 and W2 cross each other, the positional relationship between the first and second wires W1 and W2 is inverted before and after the crossing point. Specifically, when focusing on the same turns of the first and second wires W1 and W2, the first wire W1 is positioned on the left side (first flange part 21 side) in FIG. 2, and the second wire W2 is positioned on the right side (second flange part 22 side) in FIG. 2 in the first layer part L1 of the first winding block B1; whereas the first wire W1 is positioned on the right side (second flange part 22 side) in FIG. 2, and the second wire W2 is positioned on the left side (first flange part 21 side) in FIG. 2 in the second winding block B2. Thus, the first layer part L1 and the second layer part L2 are symmetric with respect to the third winding area A3, enhancing symmetry between signals flowing in the first and second wires W1 and W2, with the result that excellent high-frequency characteristics can be obtained. In addition, in the present embodiment, the number of turns in the first layer part L1 and that in the second layer part L2 are equal to each other, so that extremely excellent high-frequency characteristics can be achieved.

As illustrated in FIG. 1, in the present embodiment, the y-direction positions of the first and third terminal electrodes 41 and 43 connected with the first wire W1 are the same, and the y-direction positions of the second and fourth terminal electrodes 42 and 44 connected with the second wire W2 are the same. When viewed in the direction of the arrow V of FIG. 1, the first and third terminal electrodes 41 and 43 connected with the first wire W1 are positioned on the right side, and the second and fourth terminal electrodes 42 and 44 connected with the second wire W2 are positioned on the left side. Thus, when the first and second wires W1 and W2 are wound clockwise as viewed in the direction of the arrow V with the first and second terminal electrodes 41 and 42 as the starting point, the first wire W1 is positioned on the left side (first flange part 21 side) in FIG. 2, and the second wire W2 is positioned on the right side (second flange part 22 side) in FIG. 2 in the first winding block B1 when focusing on the same turns of the first and second wires W1 and W2 unless the wires are made to cross each other. In the present embodiment, although the first and second wires W1 and W2 cross each other in the non-layer part NL, the number of times of crossing in the non-layer part NL is an even number so that the above positional relationship is maintained over the entire area of the first layer part L1.

When the first and second wires W1 and W2 are made to cross each other in the third winding are A3, the positional relationship between the first and second wires W1 and W2 is inverted. Thus, in the second winding block B2, the first wire W1 is positioned on the right side (second flange part 22 side) in FIG. 2, and the second wire W2 is positioned on the left side (first flange part 21 side) in FIG. 2 when focusing on the same turns of the first and second wires W1 and W2.

However, as described above, when viewed in the direction of the arrow V of FIG. 1, the third terminal electrode 43 is positioned on the right side, and the fourth terminal electrode 44 is positioned on the left side, so that in order to connect the terminal ends of the respective first and second wires W1 and W2 to the third and fourth terminal electrodes 43 and 44, respectively, it is necessary to make the first and second wires W1 and W2 cross each other once again so as to restore the positional relationship to its original state. In the present embodiment, the last 24th turns, which are closest to the third and fourth electrode terminals 43 and 44, of the respective first and second wires W1 and W2 constituting the second winding block B2 are made to cross each other.

Figure 6:
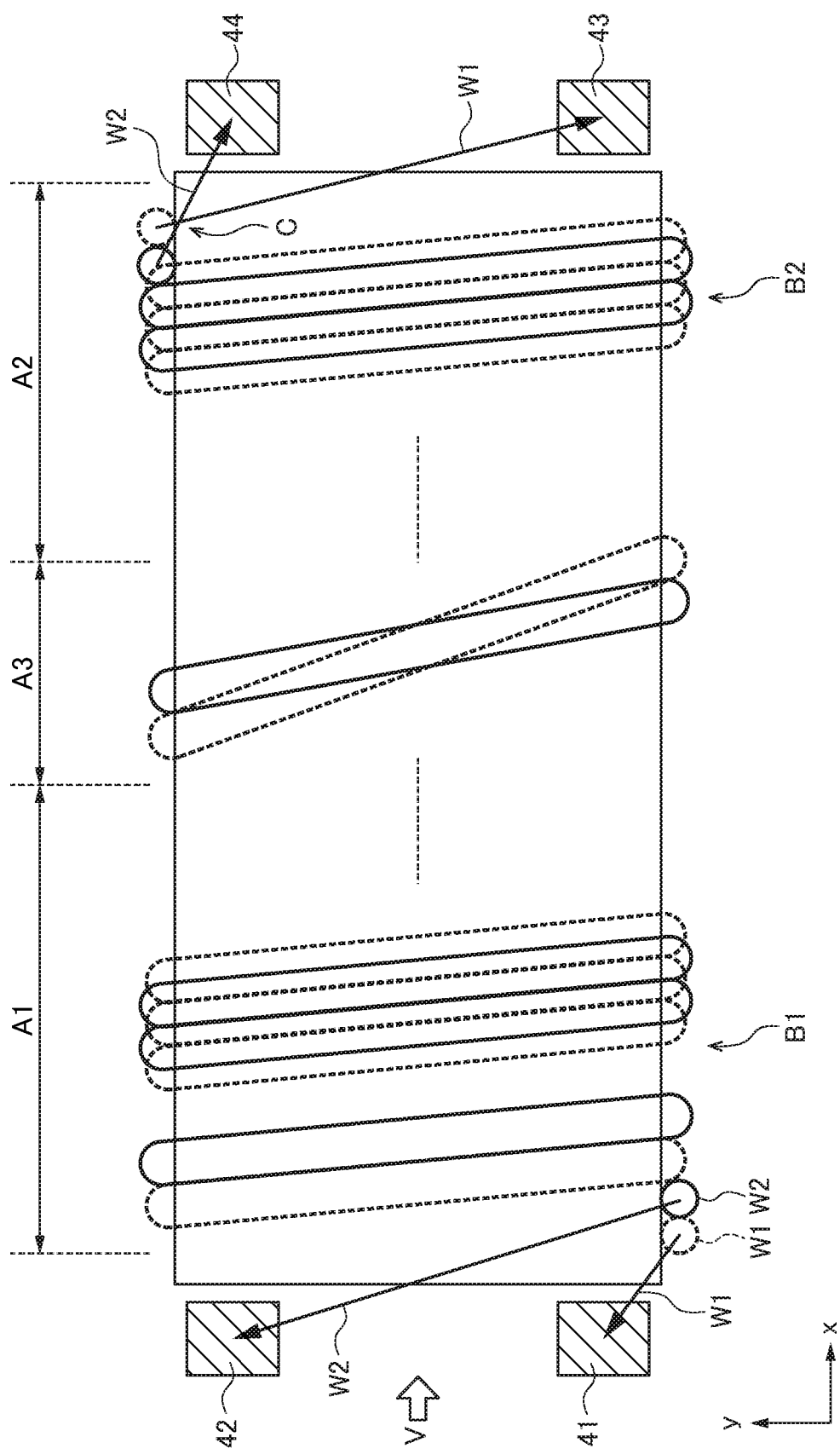
FIG. 6 is a schematic view for explaining a state where the 24th turns of the respective first and second wires cross each other.

FIG. 6 is a schematic view for explaining a state where the 24th turns of the respective first and second wires W1 and W2 cross each other.

As illustrated in FIG. 6, when viewed in the direction of the arrow V, the first terminal electrode 41 is positioned on the right side, and the second terminal electrode 42 is positioned on the left side, so that when the first and second wires W1 and W2 are wound clockwise without being made to cross each other, the first wire W1 is positioned on the first flange part 21 side, and the second wire W2 is positioned on the second flange part 22 side. This positional relationship is inverted in the second winding block B2. That is, the first wire W1 is positioned on the second flange part 22 side, and the second wire W2 is positioned on the first flange part 21 side. In order to connect the terminal ends of the respective first and second wires W1 and W2 respectively to the third and fourth terminal electrodes 43 and 44 in this state, the last 24th turns of the respective first and second wires W1 and W2 need to cross each other as denoted by the arrow C since the third terminal electrode 43 is positioned on the right side, and the fourth terminal electrode 44 is positioned on the left side as viewed in the direction of the arrow V.

Figure 7:
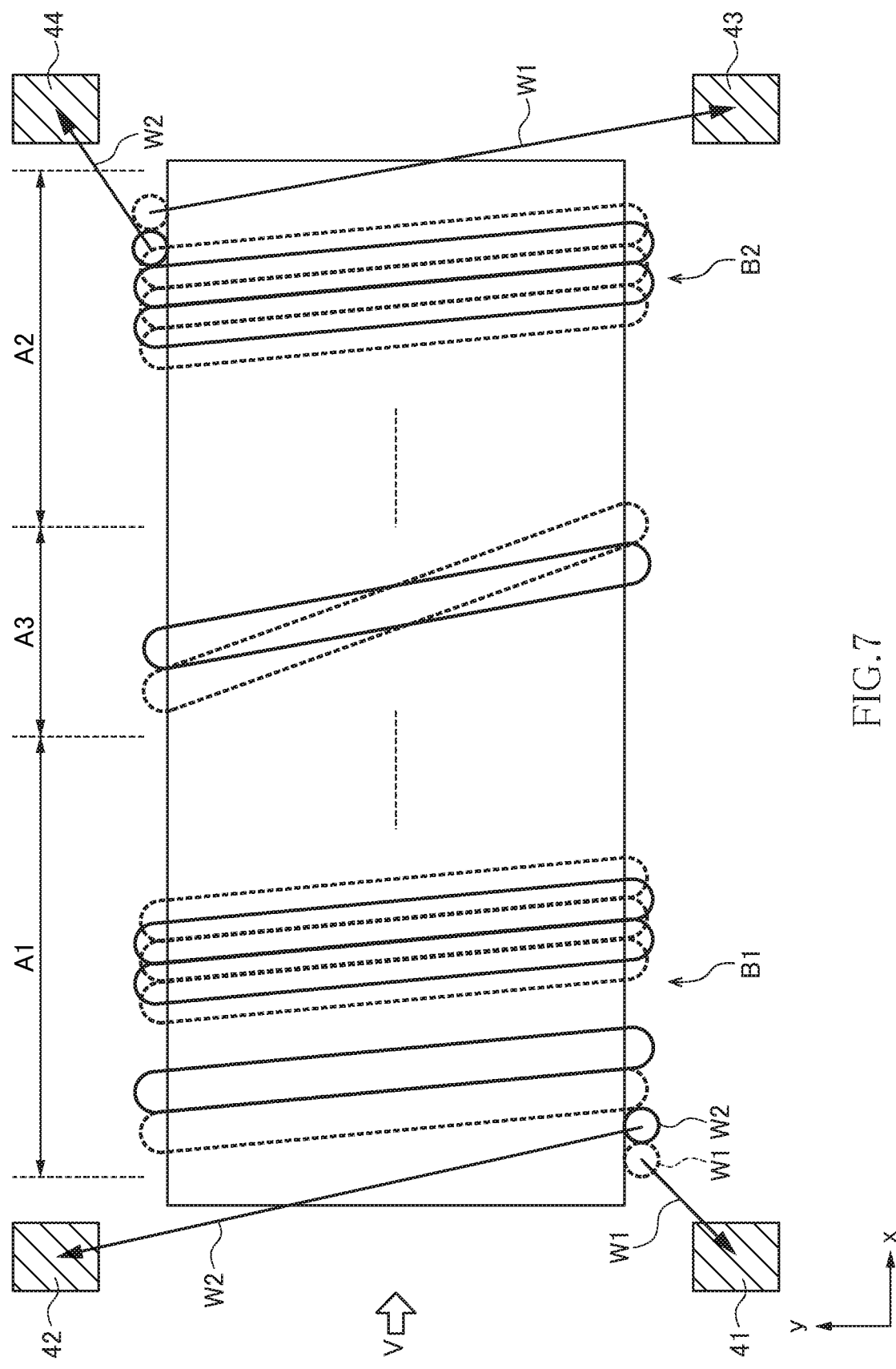
FIG. 7 is a schematic view for explaining another state where the 24th turns of the respective first and second wires cross each other.
Figure 8:
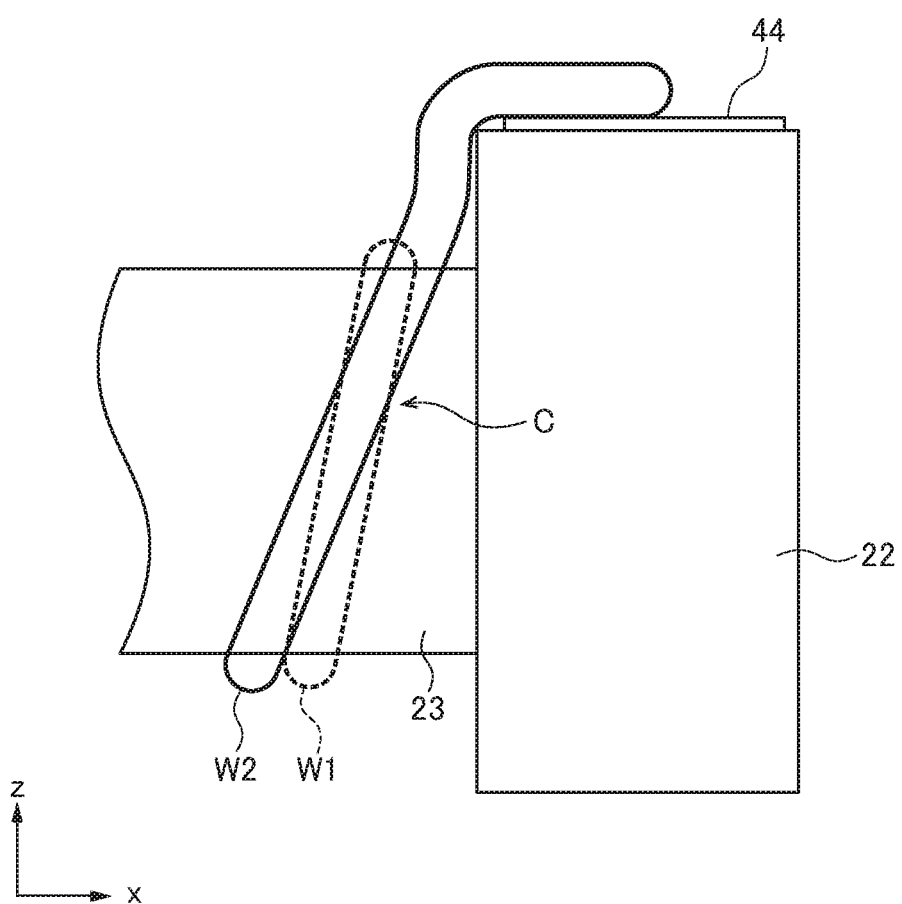
FIG. 8 is a schematic view for explaining still another state where the 24th turns of the respective first and second wires cross each other.

When the distance between the third and fourth terminal electrodes 43 and 44 in the y-direction is large as illustrated in FIG. 7, the 24th turns of the respective first and second wires W1 and W2 do not cross each other apparently as viewed from above (as viewed in the z-direction). However, in this case, as illustrated in FIG. 8, the first and second wires W1 and W2 cross each other on the xz surface (side surface 23C) of the winding core part 23. That is, at any rate, by making the 24th turns of the respective first and second wires W1 and W2 cross each other, the positional relationship between the first and second wires W1 and W2 is restored to its original state.

As described above, the one ends of the respective first and second wires W1 and W2 connected to the first and second terminal electrodes 41 and 42 do not cross each other, but the other ends of the respective first and second wires W1 and W2 connected to the third and fourth terminal electrodes 43 and 44 cross each other once. Thus, there occurs a difference between a capacitance component generated at the one end side and that generated at the other end side, and this unbalance can cause deterioration in reflection characteristics. However, in the common mode filter 10 according to the present invention, the non-layer part NL is selectively provided on the one end side of the first and second wires W1 and W2, thereby improving reflection characteristics. Although its mechanism is not yet revealed, it can be considered that the existence of the non-layer part NL may cause a new difference between a capacitance component generated at the one end side and that generated at the other end side, which contributes to suppression of the unbalance.

Further, in the present embodiment, the first and second wires W1 and W2 are made to cross each other an even number of times in the non-layer part NL, allowing high-frequency characteristics to be finely adjusted. Specifically, the common mode filter 10 having the configuration illustrated in FIGS. 1 to 3 can improve noise conversion characteristics (Ssd21 characteristics) as compared to a case where the number of times of crossing in the non-layer part is set to zero.

As described above, in the common mode filter 10 according to the present embodiment, the first and second wires W1 and W2 are made to cross each other in the third winding area A3, so that symmetry between the first and second winding blocks B1 and B2 is enhanced. Further, the non-layer part NL is included in the first winding block B1, so that unbalance caused due to the crossing of the 24th turns in the second winding block B2 is suppressed, with the result that reflection characteristics can be improved. In addition, the first and second wires W1 and W2 are made to cross each other an even number of times in the non-layer part NL, allowing high-frequency characteristics to be fine adjusted depending on the crossing position and the number of times of crossing.

Particularly, in the present embodiment, the numbers of turns of the first and second wires W1 and W2 in the non-layer part NL are both one, so that reflection characteristics in a band of 10 MHz to 400 MHz are improved. In addition, in the present embodiment, the number of turns in the first layer part L1 included in the first winding block B1 and the number of turns in the second layer part L2 included in the second winding block B2 are equal to each other, so that the first layer part L1 and the second layer part L2 are symmetric with respect to a portion where the first and second wires W1 and W2 cross each other in the third winding area A3, with the result that more excellent high-frequency characteristics can be obtained.

Hereinafter, some modifications of the common mode filter 10 will be described. The structures of the modifications described below are also included in the scope of the present invention.

Figure 9:
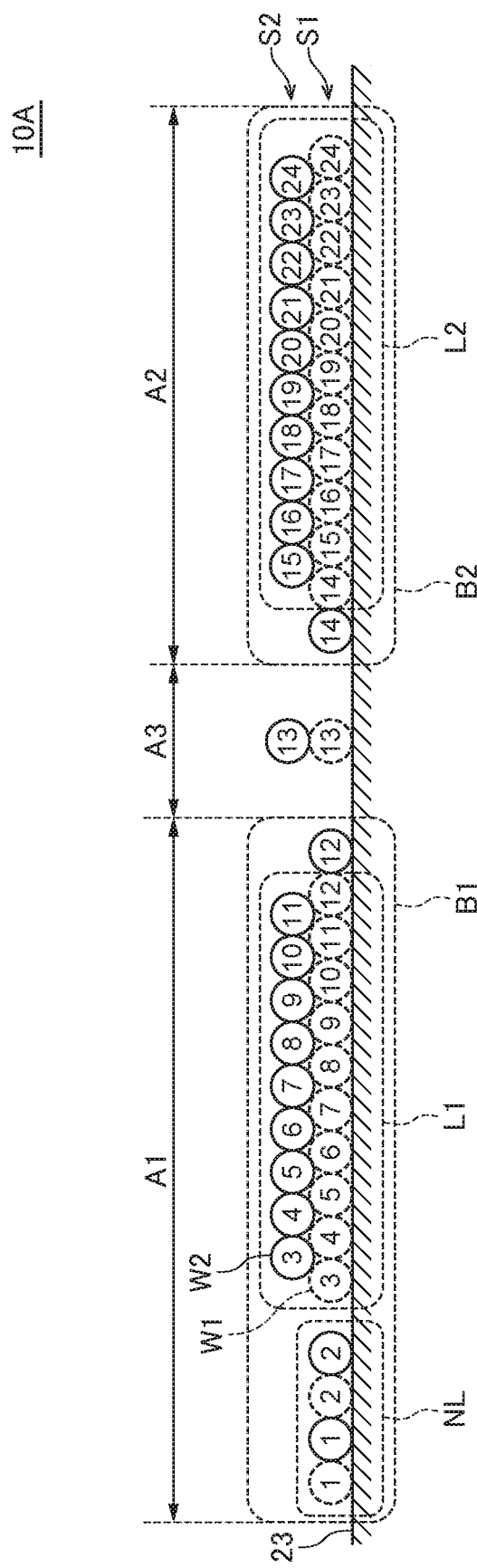
FIG. 9 is a schematic view for explaining the winding layout of a common mode filter according to a first modification.

FIG. 9 is a schematic view for explaining the winding layout of a common mode filter 10A according to a first modification.

A common mode filter 10A illustrated in FIG. 9 differs from the common mode filter 10 according to the above embodiment in that both the first and second wires W1 and W2 constituting the non-layer part NL are turned twice. In this case, the 1st turns of the respective first and second wires W1 and W2 may be made to cross each other an even number of times, the 2nd turns of the respective first and second wires W1 and W2 may be made to cross each other an even number of times, or both the 1st and 2nd turns of the respective first and second wires W1 and W2 may be made to cross each other an even number of times. As exemplified in the first modification, the numbers of turns of the first and second wires W1 and W2 constituting the non-layer part NL are not particularly limited and may be determined according to the total number of turns or target high-frequency characteristics.

Figure 10:
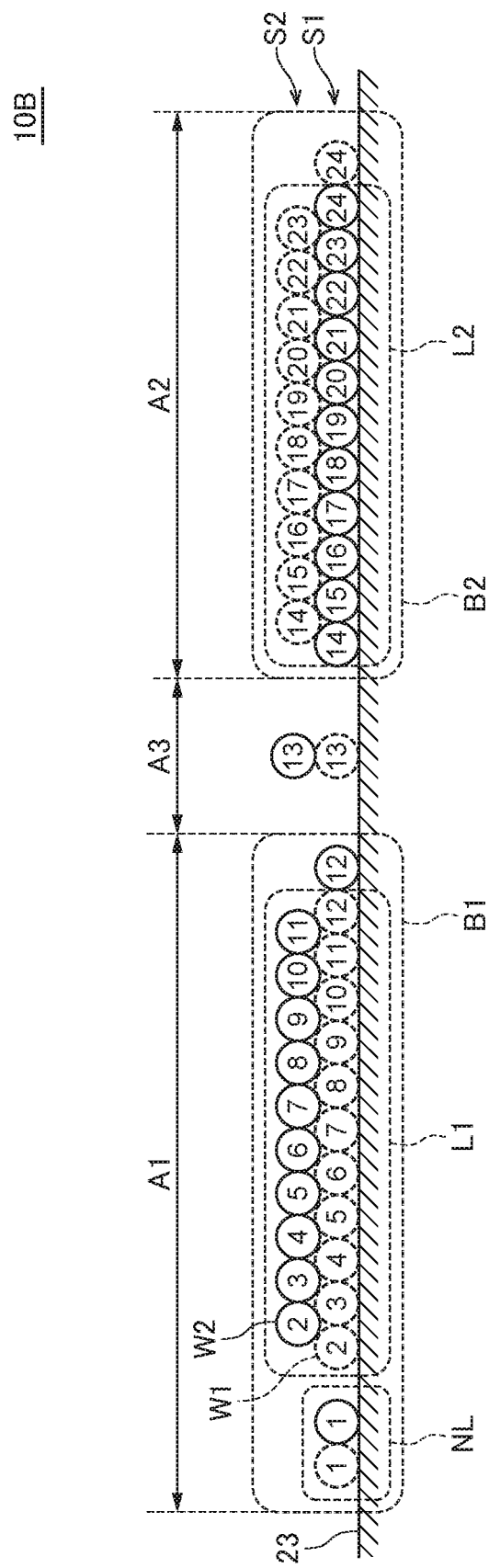
FIG. 10 is a schematic view for explaining the winding layout of a common mode filter according to a second modification.

FIG. 10 is a schematic view for explaining the winding layout of a common mode filter 10B according to a second modification.

The common mode filter 10B illustrated in FIG. 10 differs from the common mode filter 10 according to the above embodiment in that, in the second layer part L2, the second wire W2 is positioned in the first winding layer S1 (lower layer), and the first wire W1 is positioned in the second winding layer S2 (upper layer). Although the 24th turn of the first wire W1 is positioned in the first winding layer S1 (lower layer), it may be regarded as a part of the second layer part L2. As exemplified in the second modification, the vertical positional relationship between the first and second wires W1 and W2 may be inverted in the first layer part L1 and in the second layer part L2. This brings about an advantage that the lengths of the first and second wires W1 and W2 are substantially equal to each other.

Figure 11:
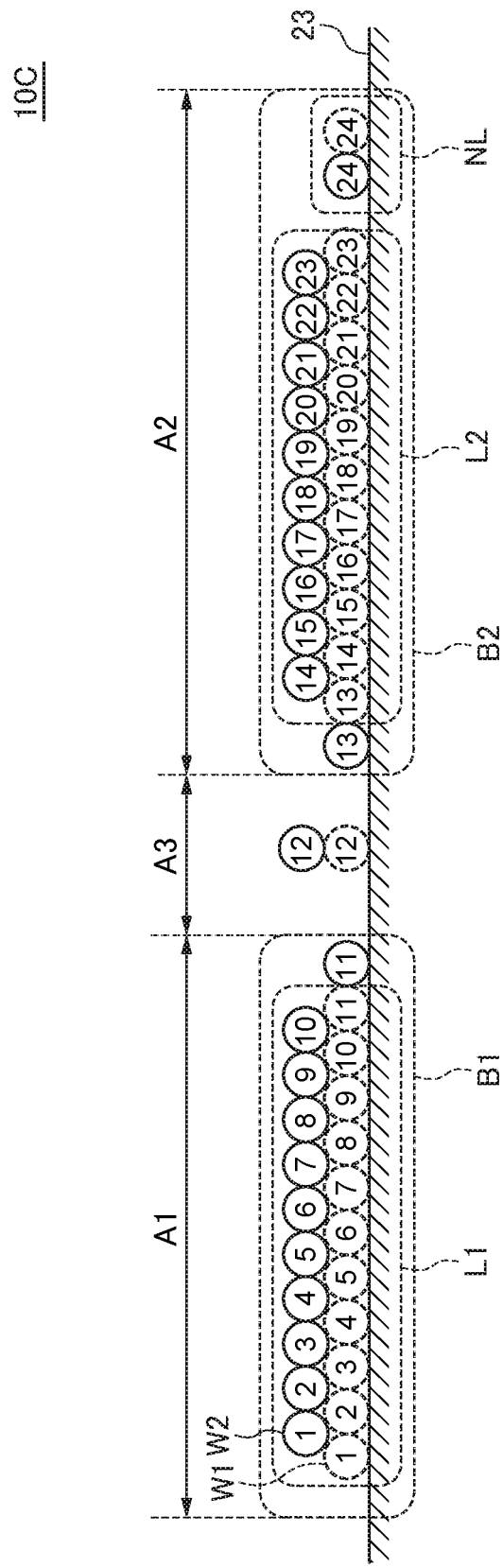
FIG. 11 is a schematic view for explaining the winding layout of a common mode filter according to a third modification.

FIG. 11 is a schematic view for explaining the winding layout of a common mode filter 10C according to a third modification.

Figure 12:
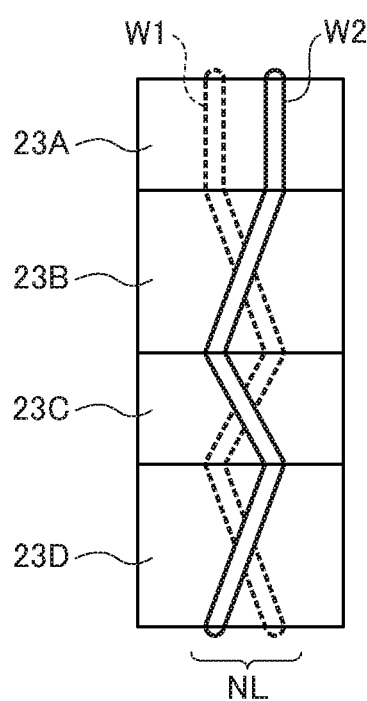
FIG. 12 is a developed view of the non-layer part according to the third modification.

In the common mode filter 10C illustrated in FIG. 11, the non-layer part NL is included in the second winding block B2. Specifically, the 1st to 11th turns of the first wire W1 and the 1st to 10th turns (or 1st to 11th turns) of the second wire W2 constitute the first layer part L1, the 12th turns of the respective first and second wires W1 and W2 cross each other, the 13th to 23rd turns of the first wire W1 and the 14th to 23rd turns (or 13th to 23rd turns) of the second wire W2 constitute the second layer part L2, and the 24th turns of the respective first and second wires W1 and W2 constitute the non-layer part NL. Like the common mode filter 10 according to the above embodiment, the 24th turns of the respective first and second wires W1 and W2 cross each other an even number of times and cross each other once in the vicinity of the third and fourth terminal electrodes 43 and 44, with the result that they cross each other an odd number of times. As shown in FIG. 12, alternatively, the first and second wires W1 and W2 may be made to cross each other three times on the winding core part 23. In this case, the necessity of crossing the first and second wires W1 and W2 once in the vicinity of the third and fourth terminal electrodes 43 and 44 is eliminated. As exemplified in the third modification, the number of times of crossing may be odd, depending on the position of the non-layer part NL.

Figure 13:
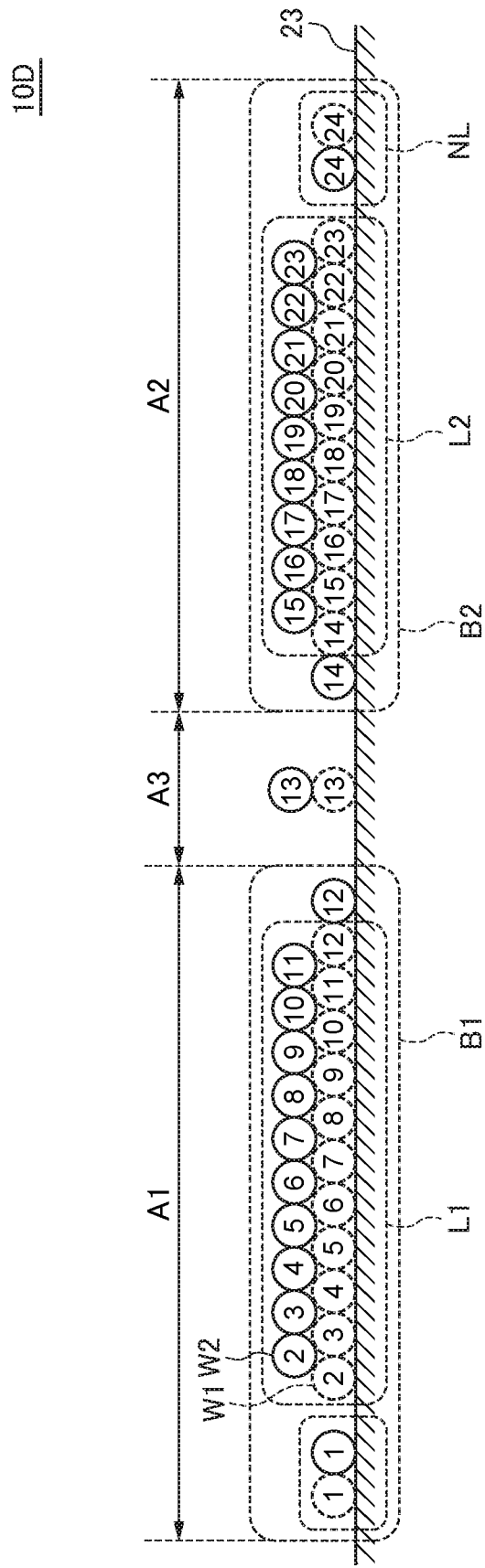
FIG. 13 is a schematic view for explaining the winding layout of a common mode filter according to a fourth modification.

FIG. 13 is a schematic view for explaining the winding layout of a common mode filter 10D according to a fourth modification.

In the common mode filter 10D illustrated in FIG. 13, the non-layer part NL is included in both the first and second winding blocks B1 and B2. Specifically, the 1st turns of the respective first and second wires W1 and W2 constitute the non-layer part NL, the 2nd to 12th turns of the first wire W1 and the 2nd to 11th turns (or 2nd to 12th turns) of the second wire W2 constitute the first layer part L1, the 13th turns of the respective first and second wires W1 and W2 cross each other, the 14th to 23rd turns of the first wire W1 and the 15th to 23rd turns (or 14th to 23rd turns) of the second wire W2 constitute the second layer part L2, and the 24th turns of the respective first and second wires W1 and W2 constitute the non-layer part NL. As exemplified in the fourth modification, the non-layer part NL may be included in both the first and second winding blocks B1 and B2, depending on required characteristics.

It is apparent that the present invention is not limited to the above embodiments, but may be modified and changed without departing from the scope and spirit of the invention.

For example, in the above embodiment, the first and second wires W1 and W2 are each wound in a direction from the 1st turn to the 24th turn at the time of manufacture; however, conversely, they may be wound in a direction from the 24th turn to the 1st turn.

What is claimed is:
1. A common mode filter comprising:
a winding core part including first, second, third, fourth, and fifth sections arranged in an axial direction in this order; and
first and second wires wound around the winding core part,
wherein the first and second wires cross each other once in each of the third and fifth sections,
wherein the first and second wires do not cross each other in each of the second and fourth sections, and
wherein the first and second wires cross each other twice in the first section.
2. The common mode filter as claimed in claim 1,
wherein the first and second wires constitute a double layer structure in each of the second and fourth sections, and
wherein the first and second wires constitute a single layer structure in the first section.
3. A common mode filter comprising:
a winding core part; and
first and second wires wound in a same direction around the winding core part,
wherein a predetermined one turn of the first wire crosses a predetermined one turn of the second wire a plurality of times,
wherein the winding core part includes a first winding area positioned on one axial end side thereof, a second winding area positioned on another axial end side thereof, and a third winding area positioned between the first and second winding areas,
wherein the first and second wires constitute a first winding block wound in the first winding area and a second winding block wound in the second winding area, the predetermined one turn of the first wire crossing the predetermined one turn of the second wire a plurality of times in order to suppress an unbalance caused by crossing the first wire and the second wire in the second winding block, wherein the first and second wires cross each other in the third winding area, wherein a space is formed between the first and second wires in the third winding area and the first and second wires in each of the first and second winding areas, and wherein the predetermined one turn of the first wire and the predetermined one turn of the second wire are included in the first winding block.

4. The common mode filter as claimed in claim 3, wherein each of the first and second winding blocks includes a first winding layer positioned in a lower layer and a second winding layer positioned on an upper layer of the first winding layer, wherein the first winding block includes a first layer part in which one of the first and second wires is positioned in the first winding layer and the other one thereof is positioned in the second winding layer and a non-layer part in which both the first and second wires are positioned in the first winding layer, and wherein the predetermined one turn of the first wire and the predetermined one turn of the second wire are included in the non-layer part.

5. The common mode filter as claimed in claim 4, wherein the second winding block includes a second layer part in which one of the first and second wires is positioned in the first winding layer and the other one thereof is positioned in the second winding layer.

6. The common mode filter as claimed in claim 5, wherein a number of turns in the first layer part and a number of turns in the second layer part are equal to each other.

7. The common mode filter as claimed in claim 5, wherein the first and second wires are positioned in the first and second winding layers, respectively, in the first layer part, and wherein the first and second wires are positioned in the second and first winding layers, respectively, in the second layer part.

8. The common mode filter as claimed in claim 5, further comprising:

a first flange part provided at the one axial end of the winding core part;

a second flange part positioned at the another axial end of the winding core part;

first and second terminal electrodes provided on the first flange part and connected respectively with one ends of the first and second wires; and third and fourth terminal electrodes provided on the second flange part and connected respectively with other ends of the first and second wires, wherein the non-layer part is positioned between the one ends of the first and second wires and the first layer part.

9. The common mode filter as claimed in claim 8, wherein the first and second wires cross each other an even number of times in the first winding block, and wherein last turns which are closest to the other ends of the respective first and second wires in the second winding block cross each other once.

10. The common mode filter as claimed in claim 3, wherein the predetermined one turn of the first wire and the predetermined one turn of the second wire cross each other a plurality of times such that one of the first and second wires is positioned on an upper side, and the other one thereof is positioned on a lower side.

11. The common mode filter as claimed in claim 3, wherein the predetermined one turn of the first wire and the predetermined one turn of the second wire cross each other four times without crossing each other more than four times.

12. The common mode filter as claimed in claim 11, wherein the predetermined one turn of the first wire and the predetermined one turn of the second wire cross each other in first, second, third, and fourth cross points, and wherein one of the first and second wires is positioned on an upper side, and other one thereof is positioned on a lower side in each of the first, second, third, and fourth cross points.

13. The common mode filter as claimed in claim 3, wherein the winding core part has a plurality of surfaces including first and second surfaces, and wherein the predetermined one turn of the first wire and the predetermined one turn of the second wire cross each other once in each of the first and second surfaces without crossing each other more than once.

14. The common mode filter as claimed in claim 13, wherein the plurality of surfaces further includes a third surface, and wherein the predetermined one turn of the first wire and the predetermined one turn of the second wire do not cross each other in the third surface.

15. The common mode filter as claimed in claim 3, wherein the first and second wires do not cross each other in the second winding block.

16. The common mode filter as claimed in claim 3, wherein the predetermined one turn of the first wire and the predetermined one turn of the second wire cross each other twice without crossing each other more than twice.

17. The common mode filter as claimed in claim 16, wherein the predetermined one turn of the first wire and the predetermined one turn of the second wire cross each other in first and second cross points, and wherein one of the first and second wires is positioned on an upper side, and other one thereof is positioned on a lower side in each of the first and second cross points.

18. The common mode filter as claimed in claim 3, wherein remaining turns of the first and second wires in the first winding block do not cross each other.

19. A common mode filter comprising:

a winding core part; and first and second wires wound around the winding core part, the first and second wires including first and second turns, wherein the first turn of the first and second wires cross each other an even number of times, wherein the second turn of the first and second wires do not cross each other, wherein the first and second wires further include a third turn, and wherein the third turn of the first and second wires cross each other an odd number of times.

* * * * *